(12) United States Patent
Park et al.

(10) Patent No.: US 9,087,701 B2
(45) Date of Patent: Jul. 21, 2015

(54) SEMICONDUCTOR DEVICE AND METHOD OF EMBEDDING TSV SEMICONDUCTOR DIE WITHIN SUBSTRATE FOR VERTICAL INTERCONNECT IN POP

(75) Inventors: DongSam Park, Kyoungki-do (KR); YongDuk Lee, Seoul (KR)

(73) Assignee: STATS ChipPAC, Ltd., Singapore (SG)

( * ) Notice: Subject to any disclaimer, the term of this patent is extended or adjusted under 35 U.S.C. 154(b) by 39 days.

(21) Appl. No.: 13/098,438

(22) Filed: Apr. 30, 2011

(65) Prior Publication Data

US 2012/0273959 A1    Nov. 1, 2012

(51) Int. Cl.
*H01L 21/00*    (2006.01)
*H01L 23/00*    (2006.01)
(Continued)

(52) U.S. Cl.
CPC ............... *H01L 24/05* (2013.01); *H01L 24/19* (2013.01); *H01L 24/96* (2013.01); *H01L 24/97* (2013.01); *H01L 25/0657* (2013.01); *H01L 25/105* (2013.01); *H01L 23/481* (2013.01); *H01L 24/03* (2013.01); *H01L 24/06* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 2224/0345* (2013.01); *H01L 2224/03452* (2013.01); *H01L 2224/03464* (2013.01); *H01L 2224/0401* (2013.01); *H01L 2224/04042* (2013.01); *H01L 2224/0557* (2013.01); *H01L 2224/05558* (2013.01); *H01L 2224/05571* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/06181* (2013.01); *H01L 2224/16145* (2013.01); *H01L 2224/16147* (2013.01); *H01L 2224/32145* (2013.01); *H01L 2224/32225* (2013.01); *H01L 2224/48091* (2013.01);
(Continued)

(58) Field of Classification Search
CPC .................... H01L 24/96; H01L 24/97; H01L 2224/73204; H01L 23/481
USPC .......................................... 438/107; 257/744
See application file for complete search history.

(56) References Cited

U.S. PATENT DOCUMENTS 6,489,685 B2    12/2002   Asahi et al.
2005/0017347 A1*    1/2005   Morimoto et al. ............ 257/703
(Continued)

*Primary Examiner* — Thao X Le
*Assistant Examiner* — Laura Dykes
(74) *Attorney, Agent, or Firm* — Robert D. Atkins; Patent Law Group: Atkins and Associates, P.C.

(57) ABSTRACT

A semiconductor device has a substrate with a first conductive layer over a surface of the substrate and a plurality of cavities exposing the first conductive layer. A first semiconductor die having conductive TSV is mounted into the cavities of the substrate. A first insulating layer is formed over the substrate and first semiconductor die and extends into the cavities to embed the first semiconductor die within the substrate. A portion of the first insulating layer is removed to expose the conductive TSV. A second conductive layer is formed over the conductive TSV. A portion of the first conductive layer is removed to form electrically common or electrically isolated conductive segments of the first conductive layer. A second insulating layer is formed over the substrate and conductive segments of the first conductive layer. A second semiconductor die is mounted over the substrate electrically connected to the second conductive layer.

18 Claims, 12 Drawing Sheets

(51) Int. Cl.
*H01L 25/10* (2006.01)
*H01L 25/065* (2006.01)
*H01L 23/48* (2006.01)

(52) U.S. Cl.
CPC .............. *H01L2224/48227* (2013.01); *H01L 2224/73204* (2013.01); *H01L 2224/73259* (2013.01); *H01L 2224/73265* (2013.01); *H01L 2224/81191* (2013.01); *H01L 2224/92125* (2013.01); *H01L 2224/97* (2013.01); *H01L 2225/0651* (2013.01); *H01L 2225/06513* (2013.01); *H01L 2225/06541* (2013.01); *H01L 2225/1035* (2013.01); *H01L 2225/1041* (2013.01); *H01L 2225/1058* (2013.01); *H01L 2924/00014* (2013.01); *H01L 2924/01079* (2013.01); *H01L 2924/01322* (2013.01); *H01L 2924/12041* (2013.01); *H01L 2924/1306* (2013.01); *H01L 2924/13091* (2013.01); *H01L 2924/14* (2013.01); *H01L 2924/15311* (2013.01); *H01L 2924/3511* (2013.01)

(56) References Cited

U.S. PATENT DOCUMENTS

| 2006/0218782 | A1* | 10/2006 | Tuominen et al. | 29/840 |
| 2006/0244137 | A1* | 11/2006 | Kikuchi et al. | 257/734 |
| 2007/0241464 | A1* | 10/2007 | Pendse et al. | 257/778 |
| 2007/0257350 | A1  | 11/2007 | Lee et al. | |
| 2010/0148316 | A1  | 6/2010  | Kim et al. | |
| 2010/0148336 | A1  | 6/2010  | Do et al. | |
| 2010/0193928 | A1* | 8/2010  | Zudock et al. | 257/686 |
| 2011/0204505 | A1  | 8/2011  | Pagaila et al. | |
| 2012/0043672 | A1  | 2/2012  | Cho et al. | |
| 2012/0056312 | A1  | 3/2012  | Pagaila et al. | |

\* cited by examiner

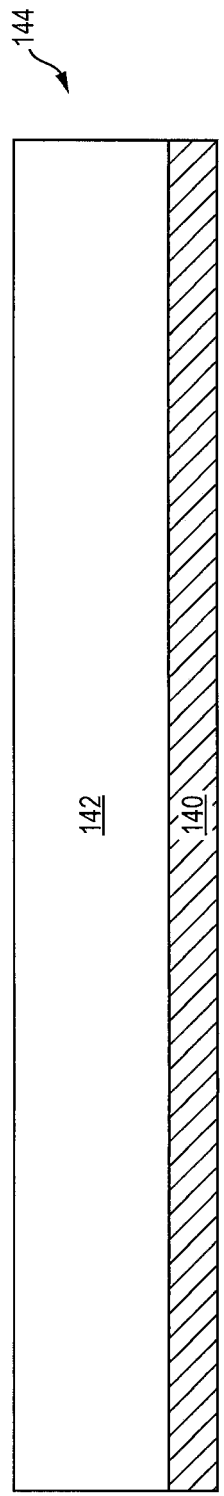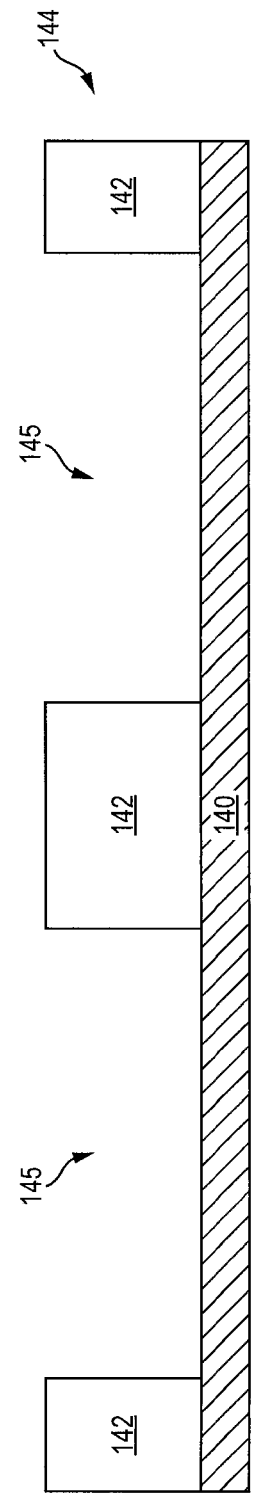

SEMICONDUCTOR DEVICE AND METHOD OF EMBEDDING TSV SEMICONDUCTOR DIE WITHIN SUBSTRATE FOR VERTICAL INTERCONNECT IN POP

FIELD OF THE INVENTION

The present invention relates in general to semiconductor devices and, more particularly, to a semiconductor device and method of embedding a TSV semiconductor die within a substrate for vertical interconnect in a semiconductor PoP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Semiconductor die are commonly stacked or otherwise require vertical z-direction interconnect capability. The vertical interconnect can be achieved with conductive through hole vias (THV) or conductive through silicon vias (TSV). The THVs and TSVs are formed by completely filling vias formed through encapsulant or base semiconductor material with electrically conductive material. The conductive vias are electrically connected to contact pads on the semiconductor die with redistribution layers (RDL). When stacking semiconductor die, the TSV or THV of the upper die is electrically connected to the TSV or THV of the lower die with bumps. The vertical interconnect provided by conductive TSV and THV typically has a large form factor and package size. The larger semiconductor package size has a lower unit density on a substrate or PCB, which increases manufacturing cost.

SUMMARY OF THE INVENTION

A need exists for a simple and cost effective vertical electrical interconnect for semiconductor PoP configurations. Accordingly, in one embodiment, the present invention is a method of making a semiconductor device comprising the steps of providing a substrate, forming a first conductive layer over a surface of the substrate, forming a plurality of cavities in the substrate to expose the first conductive layer, mounting a first semiconductor die having conductive TSV into the cavities of the substrate, forming a first insulating layer over the substrate and first semiconductor die extending into the cavities to embed the first semiconductor die within the substrate, removing a portion of the first insulating layer to expose the conductive TSV, forming a second conductive layer over the conductive TSV, removing a portion of the first conductive layer to form electrically common or electrically isolated conductive segments of the first conductive layer, and forming a second insulating layer over the substrate and conductive segments of the first conductive layer.

In another embodiment, the present invention is a method of making a semiconductor device comprising the steps of providing a first substrate with a first conductive layer and a plurality of cavities exposing the first conductive layer, mounting a first semiconductor die with conductive vias into the cavities of the first substrate, forming a first insulating layer over the first substrate and first semiconductor die, removing a portion of the first insulating layer to expose the conductive vias, forming a second conductive layer over the conductive vias, removing a portion of the first conductive layer to form electrically common or electrically isolated conductive segments of the first conductive layer, and forming a second insulating layer over the first substrate and conductive segments of the first conductive layer.

In another embodiment, the present invention is a method of making a semiconductor device comprising the steps of providing a first substrate with a first conductive layer and a plurality of cavities exposing the first conductive layer, mounting a first semiconductor die with conductive vias into the cavities of the first substrate, forming a first insulating layer over the first substrate and first semiconductor die, forming a second conductive layer over the first insulating layer electrically connected to the conductive vias, and removing a portion of the first conductive layer to form electrically common or electrically isolated conductive segments of the first conductive layer.

In another embodiment, the present invention is a semiconductor device comprising a first substrate with a first conductive layer and a plurality of cavities exposing the first conductive layer. A first semiconductor die with conductive vias is mounted into the cavities of the first substrate. A first insulating layer is formed over the first substrate and first semiconductor die. A second conductive layer is formed over the first insulating layer and electrically connected to the conductive vias. A portion of the first conductive layer is removed to form electrically common or electrically isolated conductive segments of the first conductive layer.

BRIEF DESCRIPTION OF THE DRAWINGS

FIGS. 4a-4m illustrate a process of embedding a TSV semiconductor die within a substrate for vertical interconnect in a semiconductor PoP;

DETAILED DESCRIPTION OF THE DRAWINGS

Figure 1:
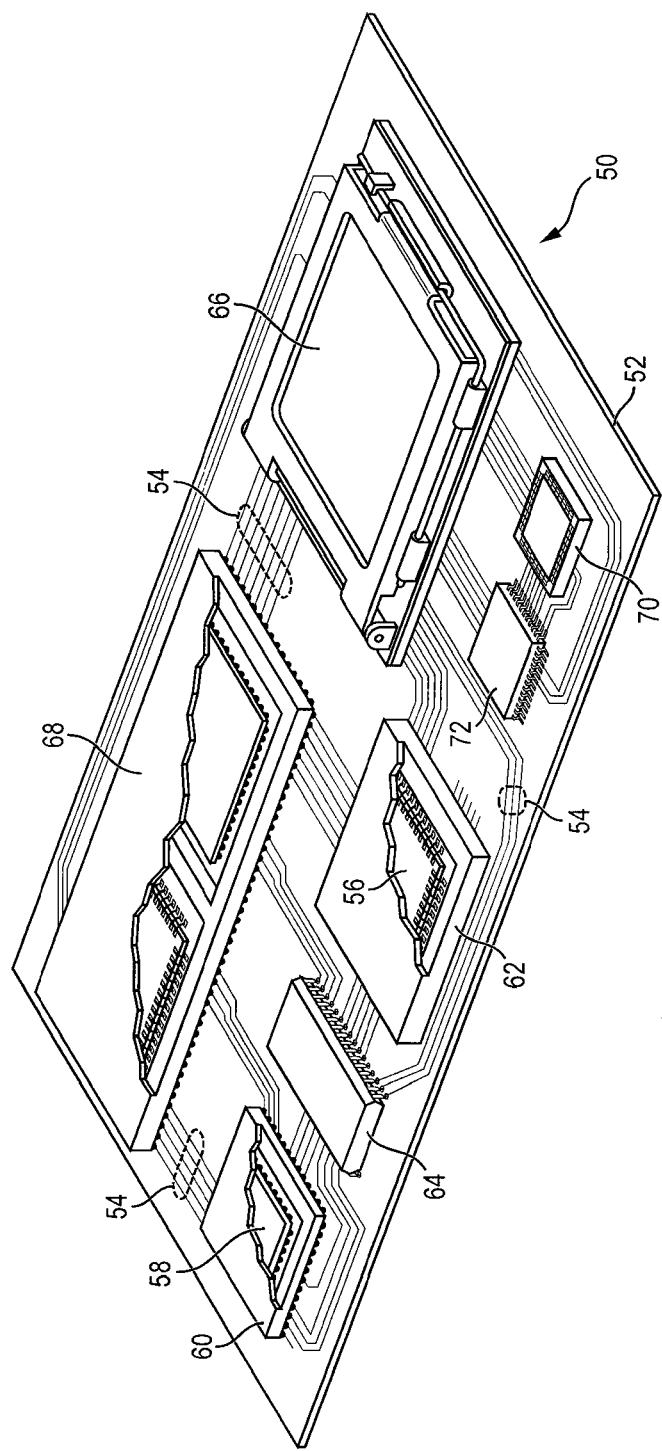
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
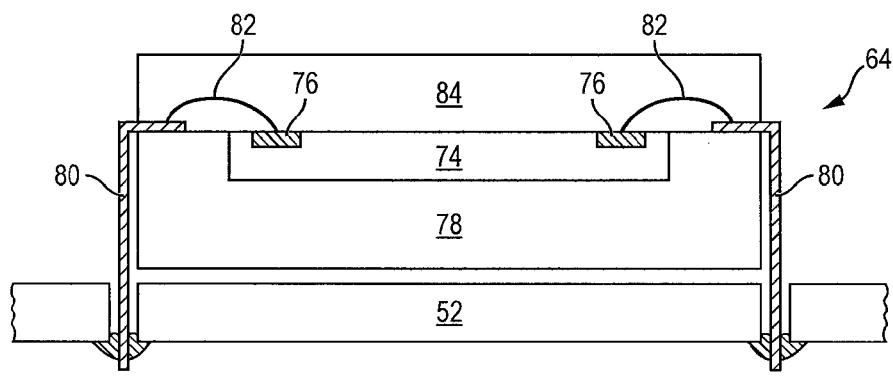
FIGS. 2a-2c illustrate further detail of the representative semiconductor packages mounted to the PCB.
Figure 2B:
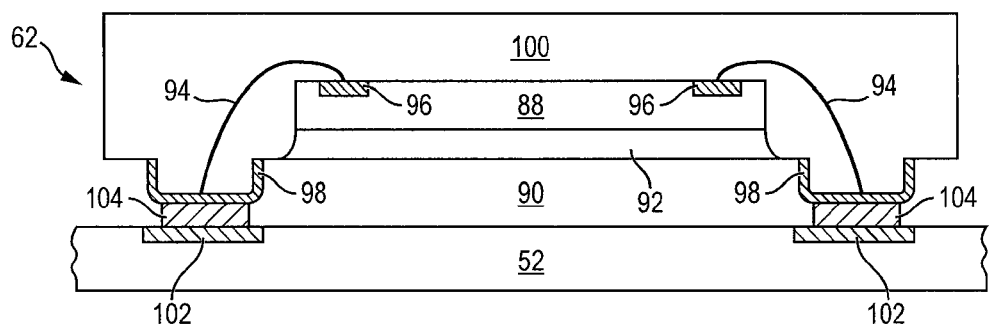
Figure 2C:
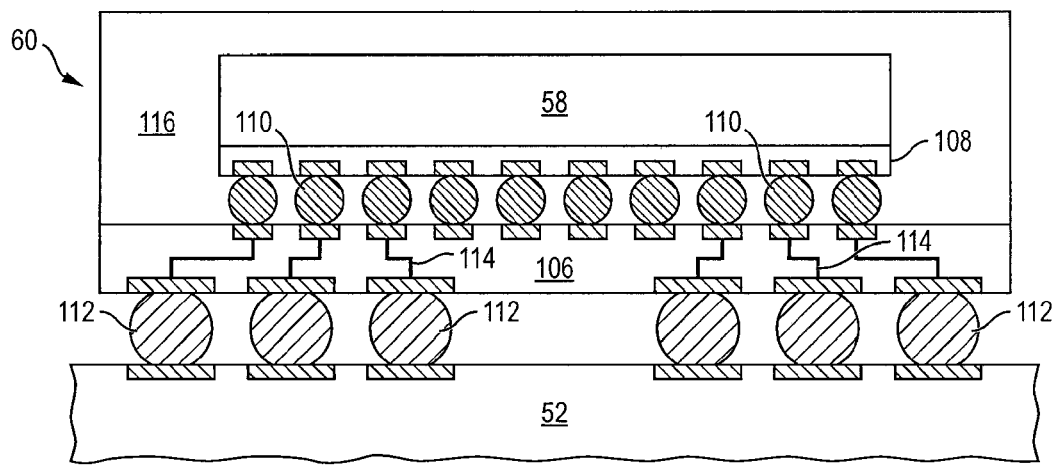

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
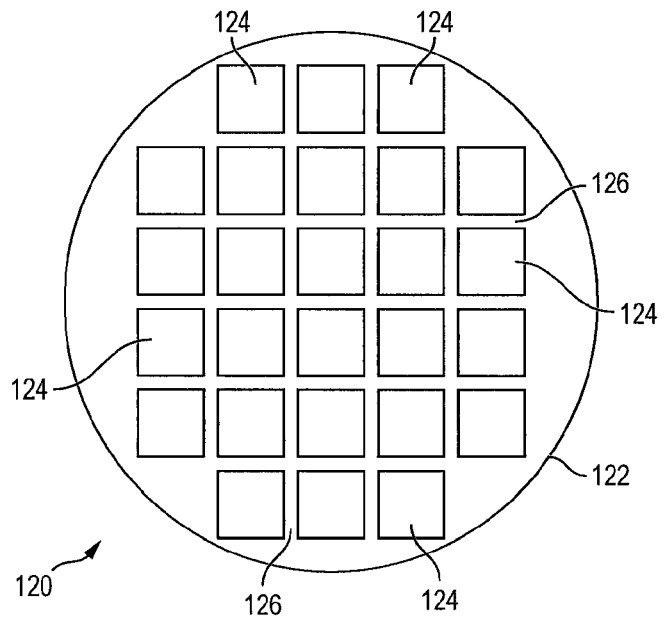
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor die 124 may have dimensions ranging from 2×2 millimeters (mm) to 15×15 mm.

Figure 3B:
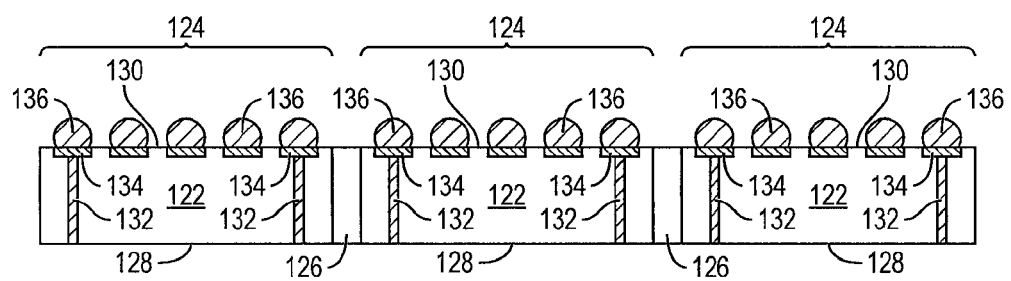

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

A plurality of vias is formed into active surface 130 and through semiconductor wafer 120 using mechanical drilling, laser drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive through silicon vias (TSV) 132 embedded within semiconductor die 124.

An electrically conductive layer 134 is formed over active surface 130 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 operates as contact pads electrically connected to the circuits on active surface 130. Contact pads 134 can be disposed side-by-side a first distance from the edge of semiconductor die 124, as shown in FIG. 3b. Alternatively, contact pads 134 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 134 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 134 using a suitable attachment or bonding process. In one embodiment, the bump material is reflowed by heating the material above its melting point to form spherical balls or bumps 136. In some applications, bumps 136 are reflowed a second time to improve electrical contact to contact pads 134. Bumps 136 can also be compression bonded to contact pads 134. Bumps 136 represent one type of interconnect structure that can be formed over contact pads 134. The interconnect structure can also use stud bump, micro bump, or other electrical interconnect.

Figure 3C:
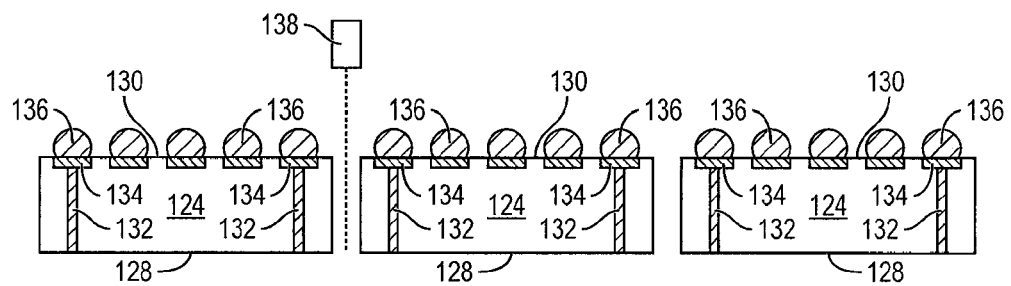

In FIG. 3c, semiconductor wafer 120 is singulated through saw street 126 using a saw blade or laser cutting tool 138 into individual TSV semiconductor die 124.

Figure 4C:
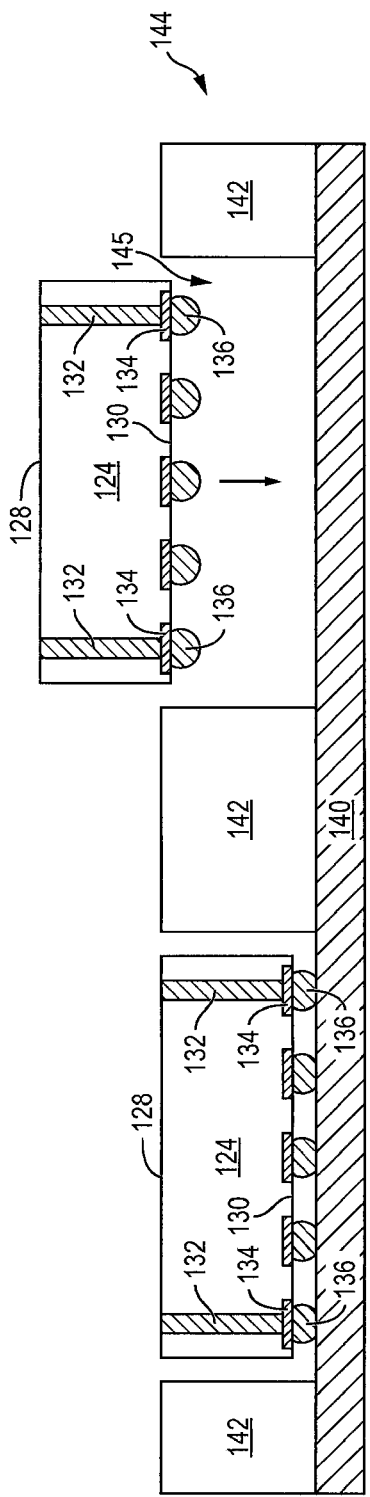

FIGS. 4a-4m illustrate, in relation to FIGS. 1 and 2a-2c, a process of embedding a TSV semiconductor die within a substrate for vertical interconnect in a semiconductor PoP. FIG. 4a shows an electrically conductive layer 140 formed over a surface of base insulating layer 142. Conductive layer 140 can be one or more layers of Al, Cu, Sn, Ni, Au, Ag, or other suitable electrically conductive material. The insulating layer 142 can be a laminate substrate made with benzocyclobutene (BCB), polyimide (PI), polybenzoxazoles (PBO), acrylic resin, or other suitable dielectric material. In one embodiment, conductive layer 140 and base insulating layer 142 constitute a copper clad laminate substrate (CCL) 144. A portion of insulating layer 142 is removed by an etching process to form cavities or openings 145 for subsequent TSV semiconductor die attach, as shown in FIG. 4b.

Figure 4D:
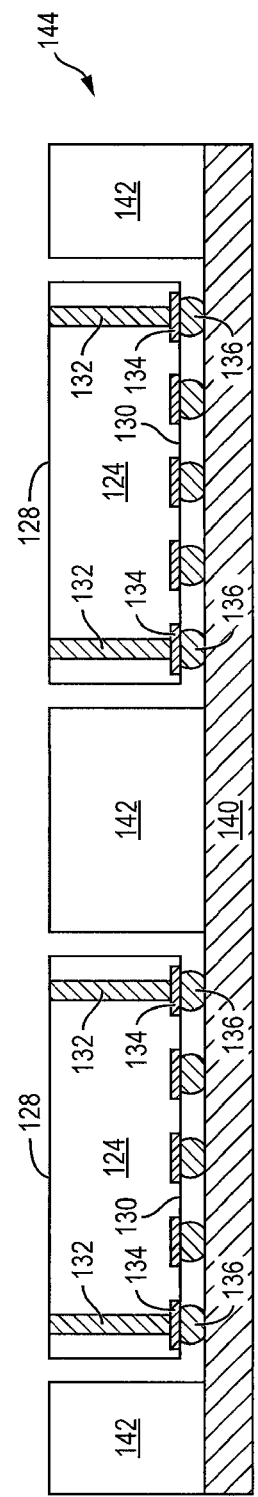

In FIG. 4c, the TSV semiconductor die 124 from FIGS. 3a-3c are mounted within cavities 145 using a pick and place operation with active surface 130 oriented toward conductive layer 140. FIG. 4d shows TSV semiconductor die 124 mounted within cavities 145 of CLL substrate 144 and electrically connected to conductive layer 140. In one embodiment, TSV semiconductor die 124 are positioned within cavities 145 so that back surface 128 is substantially coplanar with a top surface of insulating layer 142. Alternatively, back surface 128 can be positioned above or below the top surface of insulating layer 142.

Figure 4E:
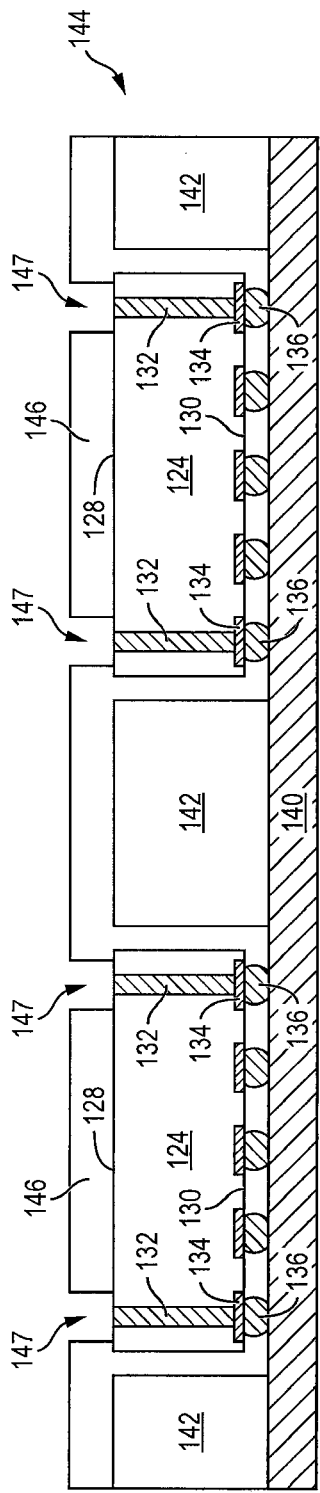

In FIG. 4e, an insulating layer 146 is formed over insulating layer 142 and back surface 128 of semiconductor die 124 using PVD, CVD, printing, spin coating, spray coating, sintering or thermal oxidation. The insulating layer 146 contains one or more layers of solder resist, SiO2, Si3N4, SiON, Ta2O5, Al2O3, or other material having similar insulating and structural properties. In one embodiment, insulating layer 146 has a thickness of 10-20 micrometers (μm) over back surface 128 and insulating layer 142. The insulating layer 146 extends into cavities 145 along the side surfaces of semiconductor die 124 to conductive layer 140 to embed the TSV semiconductor die within CCL substrate 144. A portion of insulating layer 146 is removed by a patterning, developing, and etching process to form openings 147 and expose back surface 128 and conductive TSV 132.

Figure 4F:
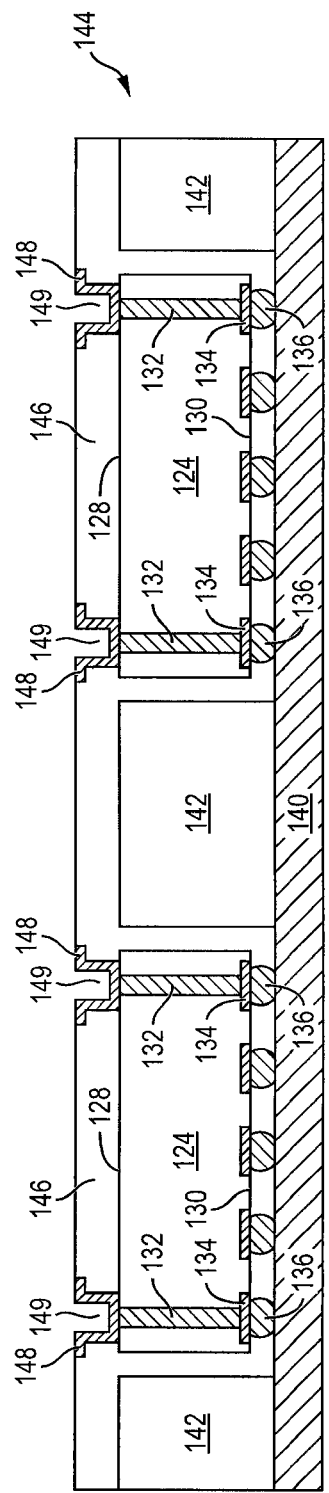

In FIG. 4f, an electrically conductive layer 148 is conformally applied over openings 147 in insulating layer 146 using patterning with PVD, CVD, sputtering, electrolytic plating, electroless plating process, or other suitable metal deposition process. Conductive layer 148 can be one or more layers of Al, Cu, Sn, Ni, Au, Ag, Ti, TiW, or other suitable electrically conductive material. Conductive layer 148 is conformally applied on the sidewalls of openings 147 to follow a contour of insulating layer 146. Conductive layer 148 is thus recessed within insulating layer 146 with an open central portion 149 above the bottom surface of the conductive layer due to the thickness of the insulating layer. Conductive layer 148 is electrically connected to conductive TSV 132.

Figure 4G:
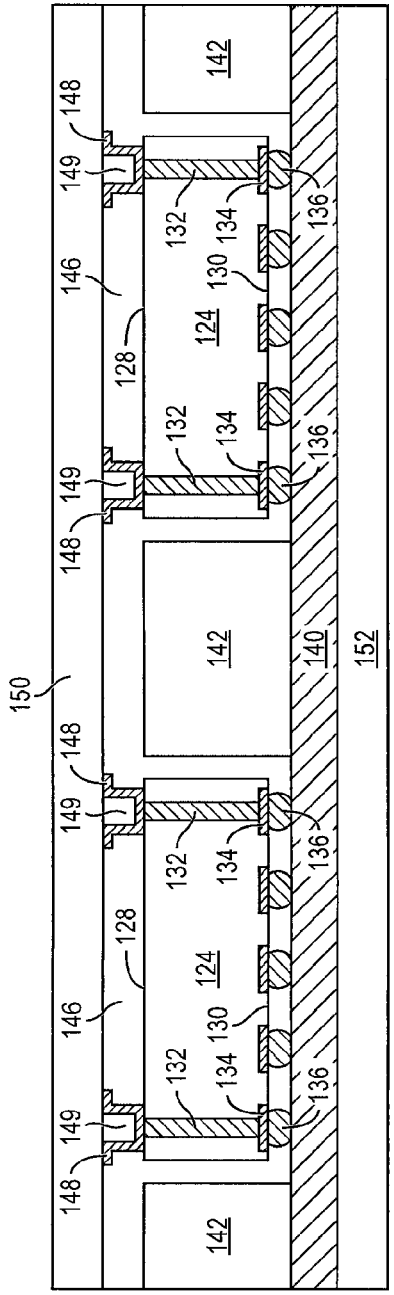

In FIG. 4g, an insulating layer 150 is formed over insulating layer 146. Likewise, an insulating layer 152 is formed over conductive layer 140. In one embodiment, insulating layers 150 and 152 can be a photo-sensitive dry film layer suitable for patterning and developing, such as photo resist or polymer material.

Figure 4H:
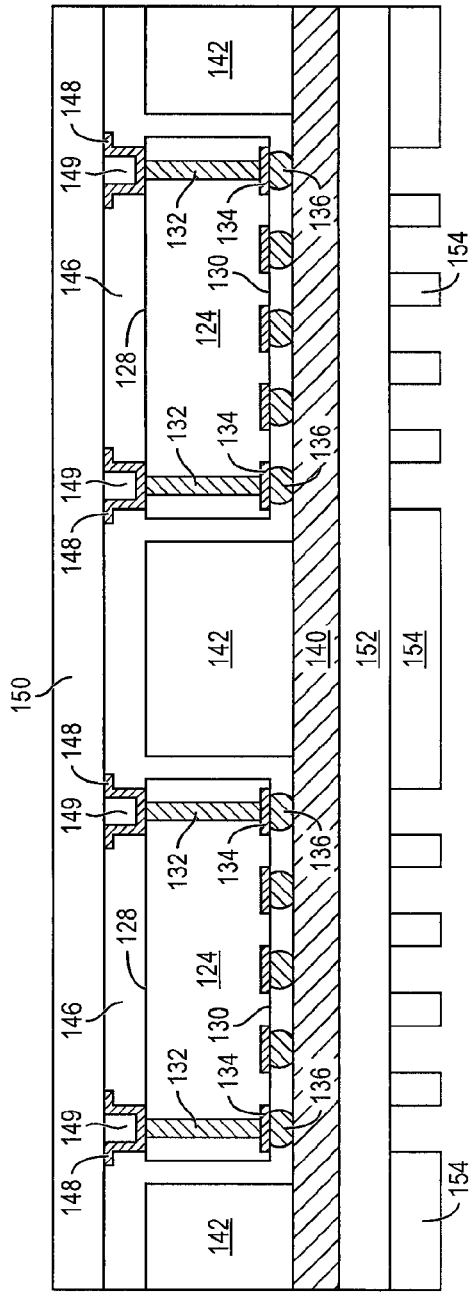
Figure 4I:
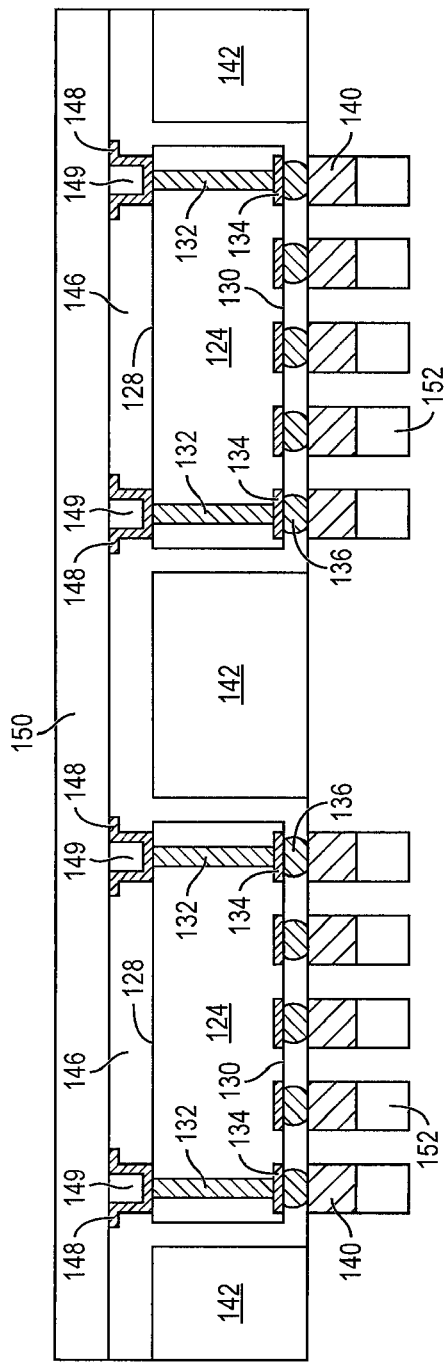
Figure 4J:
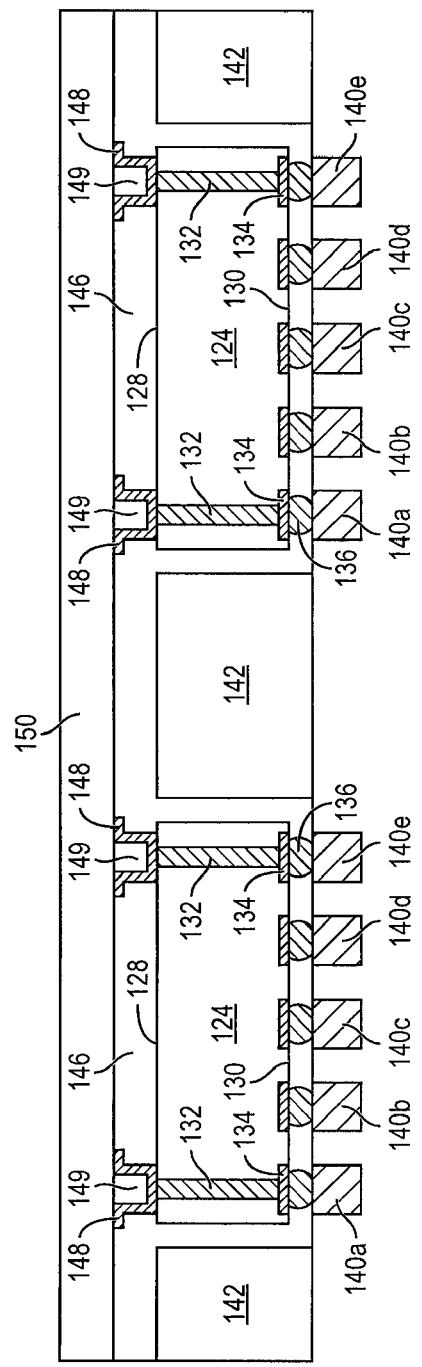

In FIG. 4h, a photo-mask layer 154 is formed over insulating layer 152 and conductive layer 140 for patterning and developing the insulating layer in order to remove a portion of the conductive layer. Photo-mask layer 154 is removed in FIG. 4i and the remaining portion of insulating layer 152 is removed in FIG. 4j to leave conductive layer 140 etched with the desired pattern containing a plurality of conductive segments 140a-140e for electrical connection to semiconductor die 124 through bumps 136. The post-etched conductive segments 140a-140e are electrically common or electrically isolated depending on the design and function of semiconductor die 124.

Figure 4K:
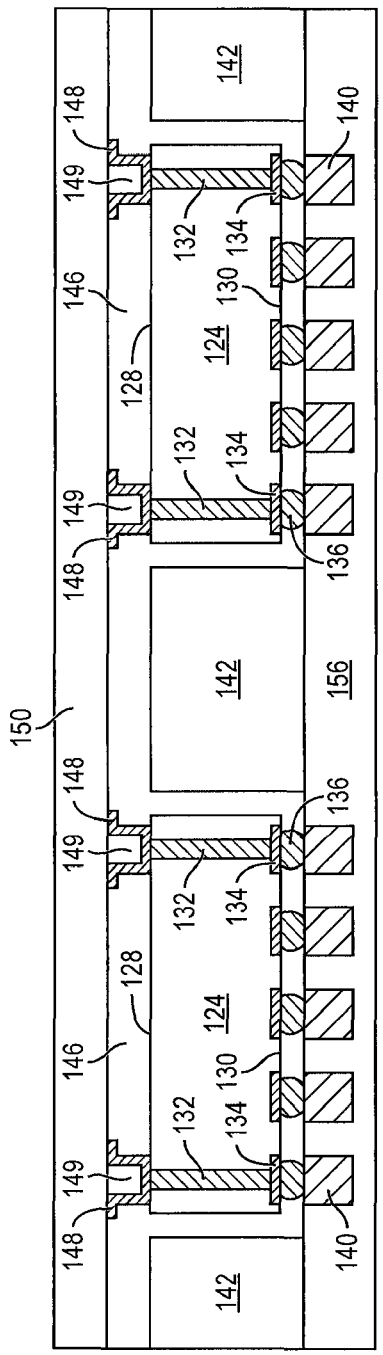
Figure 4L:
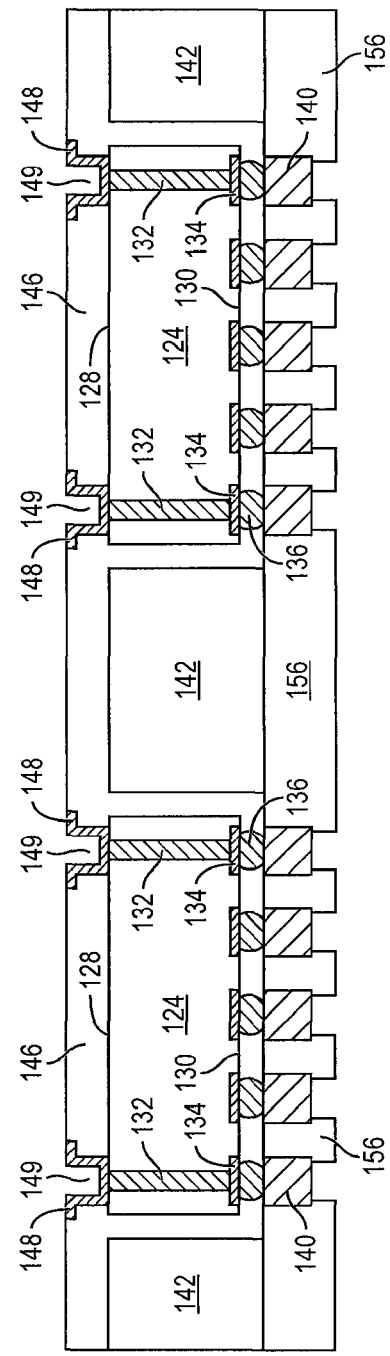

In FIG. 4k, an insulating or passivation layer 156 is formed over conductive layer 140 and insulating layer 142 using PVD, CVD, printing, spin coating, spray coating, sintering or thermal oxidation. The insulating layer 156 contains one or more layers of solder resist, silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 156 is removed by a patterning and developing process to expose conductive layer 140, as shown in FIG. 4l. The insulating layer 150 is also removed to expose insulating layer 146 and conductive layer 148. The exposed conductive layers 146 and 148 can be treated with copper on organic solderability preservative (CuOSP) or Ni/Au.

Figure 4M:
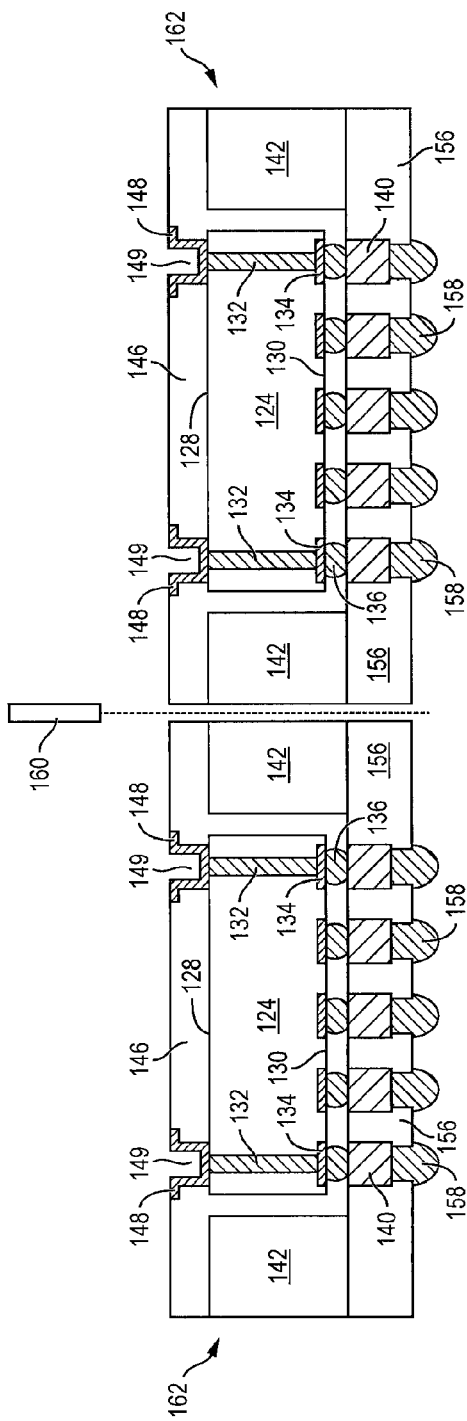

In FIG. 4m, an electrically conductive bump material is deposited over conductive segments 140a-140e using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive segments 140a-140e using a suitable attachment or bonding process. In one embodiment, the bump material is reflowed by heating the material above its melting point to form spherical balls or bumps 158. In some applications, bumps 158 are reflowed a second time to improve electrical contact to conductive segments 140a-140e. Bumps 158 can also be compression bonded to conductive segments 140a-140e. Bumps 158 represent one type of interconnect structure that can be formed over conductive segments 140a-140e. The interconnect structure can also use stud bump, micro bump, or other electrical interconnect.

The semiconductor device is singulated through insulating layers 142, 146, and 156 between semiconductor die 124 using a saw blade or laser cutting tool 160 to separate individual semiconductor packages 162.

Figure 5:
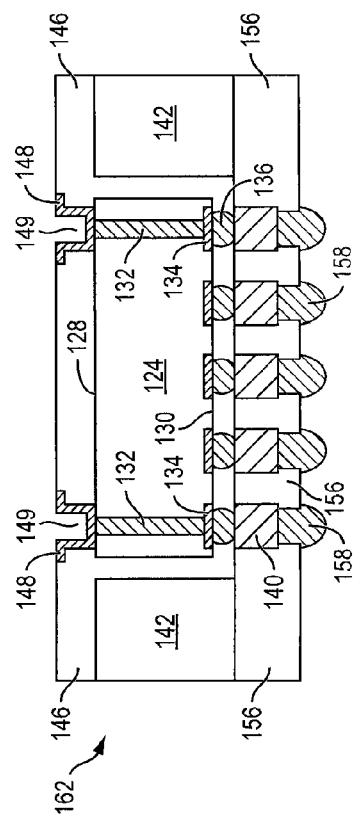
FIG. 5 illustrates the TSV semiconductor die within the substrate for vertical interconnect in the PoP.

FIG. 5 shows semiconductor package 162 after singulation. The TSV semiconductor die 124 is embedded within CCL substrate 144 and electrically connected through bumps 136 and conductive segments 140a-140e to bumps 158 for external interconnect from a bottom side of semiconductor package 162. Semiconductor die 124 is also electrically connected through conductive TSV 132 within the die and conductive layer 148 for external interconnect from a topside of semiconductor package 162. The vertical interconnect provided by conductive TSV 132 and conductive layers 140 and 148 achieve a smaller form factor to reduce the package footprint. The smaller size of semiconductor package 162 gives a high unit density on a substrate or PCB, which reduces manufacturing cost.

Figure 6A:
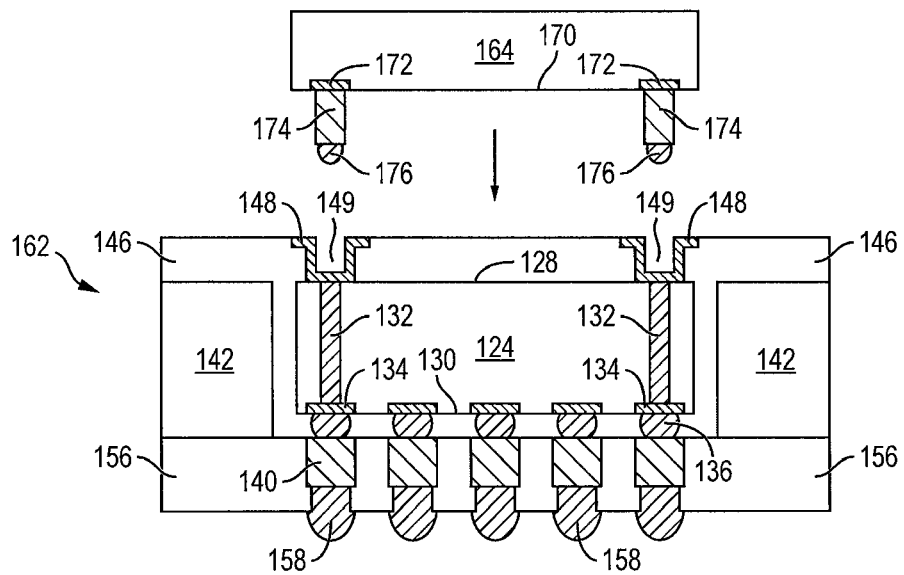
FIGS. 6a-6b illustrate the semiconductor PoP with a second semiconductor die mounted to the embedded TSV semiconductor die.

FIG. 6a shows a semiconductor die 164 having an active surface 170 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 170 to implement analog circuits or digital circuits, such as DSP, ASIC, memory, or other signal processing circuit. Semiconductor die 164 may also contain IPDs, such as inductors, capacitors, and resistors, for RF signal processing. In one embodiment, semiconductor die 164 is a flipchip type die.

An electrically conductive layer 172 is formed over active surface 170 using PVD, CVD, electrolytic plating, electroless plating process, or other suitable metal deposition process. Conductive layer 172 can be one or more layers of Al, Cu, Sn, Ni, Au, Ag, or other suitable electrically conductive material. Conductive layer 172 operates as contact pads electrically connected to the circuits on active surface 170. Contact pads 172 can be disposed side-by-side a first distance from the edge of semiconductor die 164. Alternatively, contact pads 172 can be offset in multiple rows such that a first row of contact pads is disposed a first distance from the edge of the die, and a second row of contact pads alternating with the first row is disposed a second distance from the edge of the die.

Figure 6B:
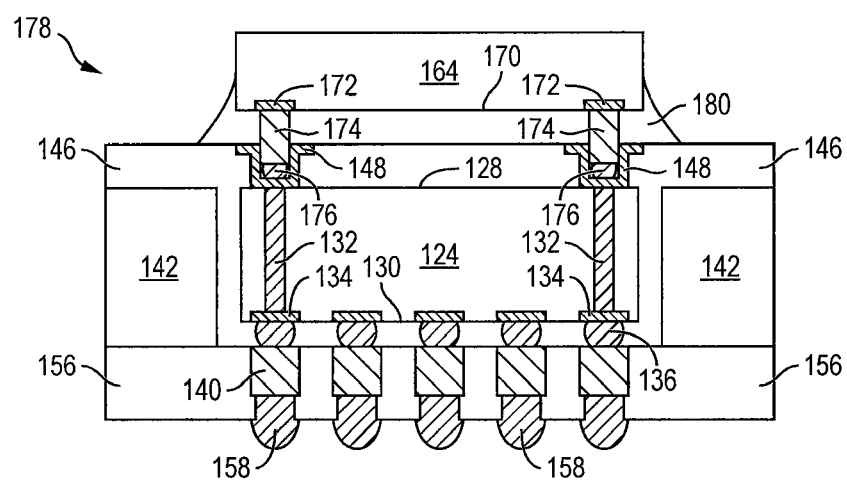

A plurality of non-collapsible non-fusible conductive posts 174 is formed over contact pads 172. Fusible bumps 176 are formed over conductive posts 174. The combination of conductive posts 174 and bumps 176 constitute a composite interconnect structure with the non-collapsible conductive posts providing a fixed vertical offset and the bumps providing a fusible bonding surface. Semiconductor die 164 is mounted to semiconductor package 162 in a package-on-package (PoP) configuration 178 with conductive posts 174 extending partially into open portion 149 and bumps 176 electrically connected to conductive layer 148, as shown in FIG. 6b. In one embodiment, semiconductor die 164 is a memory die and semiconductor die 124 is a baseband signal processing die. Conductive posts 174 give vertical offset for semiconductor die 164 to account for the thickness of insulating layer 146 and the recessed conductive layer 148. Semiconductor die 164 is electrically connected through conductive posts 174, bumps 176, conductive layer 148, and conductive TSV 132 to semiconductor die 124. Semiconductor die 164 is also electrically connected to conductive layer 140 and bumps 158 for external interconnect. An underfill material 180, such as epoxy resin, is deposited between semiconductor die 164 and semiconductor package 162. Semiconductor PoP 178 exhibits reduced susceptibility to warpage and high surface mount technology (SMT) yield with a small form factor. Semiconductor PoP 178 uses a simplified assembly process for higher productivity in terms of manufacturing units per hour (UPH) at lower production cost for the semiconductor PoP.

Figure 7:
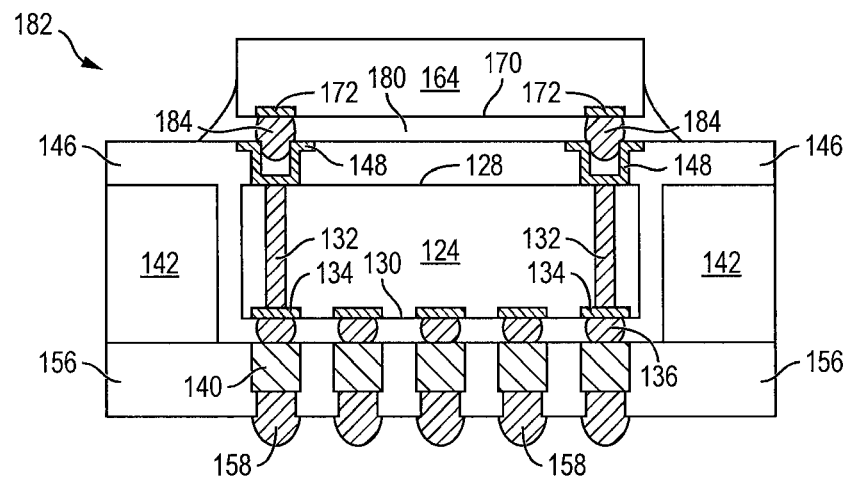
FIG. 7 illustrates the second semiconductor die mounted to the embedded TSV semiconductor die with bumps.

FIG. 7 shows an embodiment of semiconductor PoP 182, similar to FIG. 6b, with fusible bumps 184 between contact pads 172 of semiconductor die 164 and conductive layer 148. Bumps 184 are sufficiently large to make electrical connection with the recessed conductive layer 148, while providing vertical offset for semiconductor die 164.

Figure 8:
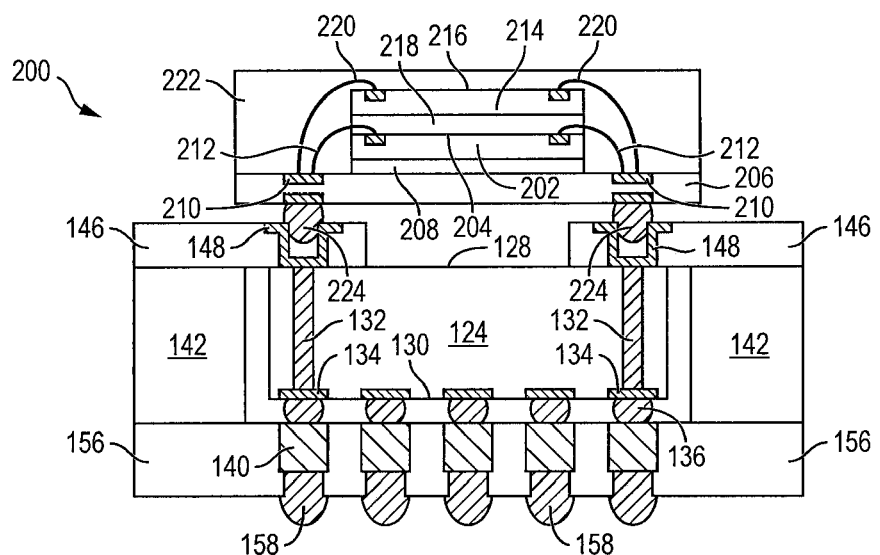
FIG. 8 illustrates a substrate with stacked semiconductor die mounted to the embedded TSV semiconductor die.

FIG. 8 shows an embodiment of semiconductor PoP 200, similar to FIG. 6b, with a portion of insulating layer 146 removed to expose back surface 128 of semiconductor die 124. Semiconductor die 202 has an active surface 204 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 204 to implement analog circuits or digital circuits, such as DSP, ASIC, memory, or other signal processing circuit. Semiconductor die 202 may also contain IPDs, such as inductors, capacitors, and resistors, for RF signal processing. Semiconductor die 202 is mounted to substrate 206 with die attach adhesive 208. The contact pads of semiconductor die 202 are electrically connected to conductive traces 210 formed on substrate 206 with bond wires 212.

Semiconductor die 214 has an active surface 216 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 216 to implement analog circuits or digital circuits, such as DSP, ASIC, memory, or other signal processing circuit. Semiconductor die 214 may also contain IPDs, such as inductors, capacitors, and resistors, for RF signal processing. Semiconductor die 214 is mounted to semiconductor die 202 with die attach adhesive 218. The contact pads of semiconductor die 214 are electrically connected to conductive traces 210 formed on substrate 206 with bond wires 220.

An encapsulant or molding compound 222 is deposited over semiconductor die 202 and 214 and substrate 206 using a paste printing, compressive molding, transfer molding, liquid encapsulant molding, vacuum lamination, spin coating, or other suitable applicator. Encapsulant 222 can be polymer composite material, such as epoxy resin with filler, epoxy acrylate with filler, or polymer with proper filler. Encapsulant 222 is non-conductive and environmentally protects the semiconductor device from external elements and contaminants.

Substrate 206, with stacked semiconductor die 202 and 214 enclosed by encapsulant 222, is mounted to semiconductor package 162 with bumps 224 extending partially into open portion 149 to electrically connect to conductive layer 148. The exposed back surface 128 provides enhanced heat dissipation for semiconductor die 124.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a substrate;
forming a first conductive layer over a surface of the substrate;
forming a cavity in the substrate to expose the first conductive layer;
disposing a first semiconductor die including a conductive via into the cavity of the substrate with the conductive via electrically connected to the first conductive layer;
forming an insulating layer over the substrate and first semiconductor die and extending into the cavity to embed the first semiconductor die within the substrate;
removing a portion of the insulating layer to the conductive via;
forming a second conductive layer over the conductive via; and
removing a portion of the first conductive layer while leaving conductive segments of the first conductive layer electrically connected to the first semiconductor die to provide a vertical interconnect through the conductive via to the second conductive layer, the vertical interconnect disposed within a footprint of the first semiconductor die.

2. The method of claim 1, further including forming a plurality of bumps over the conductive segments of the first conductive layer.

3. The method of claim 1, further including singulating the substrate to separate the first semiconductor die.

4. The method of claim 1, further including conformally applying the second conductive layer to follow a contour of the insulating layer into the removed portion of the insulating layer.

5. The method of claim 1, further including disposing a second semiconductor die over the substrate electrically connected to the second conductive layer.

6. The method of claim 5, further including:
forming non-collapsible conductive posts over contact pads of the second semiconductor die; and
forming fusible bumps over the non-collapsible conductive posts.

7. A method of making a semiconductor device, comprising:
providing a first substrate;
forming a first conductive layer over the first substrate;
forming a cavity in the first substrate to expose the first conductive layer;
disposing a first semiconductor die including a conductive via into the cavity of the first substrate with a first surface of the first semiconductor die oriented towards the first conductive layer;
forming an insulating layer over the first substrate and a second surface of the first semiconductor die opposite the first surface with the insulating layer extending into the cavity to embed the first semiconductor die within the first substrate;
forming a second conductive layer into an opening of the insulating layer to contact the conductive via; and
removing a portion of the first conductive layer while leaving conductive segments of the first conductive layer electrically connected to the first semiconductor die to provide a vertical interconnect through the conductive via to the second conductive layer.

8. The method of claim 7, further including forming an interconnect structure over the conductive segments of the first conductive layer.

9. The method of claim 7, further including conformally applying the second conductive layer to follow a contour of the opening of the insulating layer.

10. The method of claim 7, further including disposing a second semiconductor die over the first substrate electrically connected to the second conductive layer.

11. The method of claim 10, further including forming an interconnect structure over contact pads of the second semiconductor die.

12. The method of claim 7, further including:
providing a second substrate;
disposing a second semiconductor die over the first substrate;
disposing a third semiconductor die over the second semiconductor die; and
disposing the second substrate over the second conductive layer.

13. A method of making a semiconductor device, comprising:
providing a first substrate;
forming a first conductive layer over the first substrate;
forming a cavity in the first substrate extending to expose the first conductive layer;
disposing a first semiconductor die including a conductive via into the cavity of the first substrate;
forming a first insulating layer over a top surface of the first substrate opposite the first conductive layer and over the first semiconductor die and extending into the cavity to embed the first semiconductor die within the first substrate;

forming a second conductive layer over the first insulating layer electrically connected to the conductive via; and removing a portion of the first conductive layer while leaving conductive segments of the first conductive layer electrically connected to the first semiconductor die to provide a vertical interconnect through the conductive via to the second conductive layer.

14. The method of claim 13, further including forming a second insulating layer over the first substrate and conductive segments of the first conductive layer.

15. The method of claim 13, further including forming an interconnect structure over the conductive segments of the first conductive layer.

16. The method of claim 13, further including conformally applying the second conductive layer to follow a contour of the first insulating layer.

17. The method of claim 13, further including disposing a second semiconductor die over the first substrate electrically connected to the second conductive layer.

18. The method of claim 13, further including:

providing a second substrate;

disposing a second semiconductor die over the first substrate;

disposing a third semiconductor die over the second semiconductor die; and disposing the second substrate over the second conductive layer.

* * * * *